US011342122B2

(12) United States Patent
Masunari

(10) Patent No.: US 11,342,122 B2
(45) Date of Patent: May 24, 2022

(54) ELECTRONIC COMPONENT ASSEMBLY AND METHOD FOR MANUFACTURING THE SAME

(71) Applicant: Murata Manufacturing Co., Ltd., Nagaokakyo (JP)

(72) Inventor: Akio Masunari, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 69 days.

(21) Appl. No.: 16/855,221

(22) Filed: Apr. 22, 2020

(65) Prior Publication Data
US 2020/0365326 A1    Nov. 19, 2020

(30) Foreign Application Priority Data

May 15, 2019    (JP) .............................. JP2019-092147

(51) Int. Cl.
*H01G 2/06*    (2006.01)
*H01G 4/012*    (2006.01)
(Continued)

(52) U.S. Cl.
CPC ............... *H01G 4/30* (2013.01); *H01G 2/065* (2013.01); *H01G 4/012* (2013.01); *H01G 4/1218* (2013.01)

(58) Field of Classification Search
CPC .......... H01G 2/065; H01G 2/06; H01G 4/012; H01G 4/1218; H01G 4/232; H01G 4/2325;
(Continued)

(56) References Cited

U.S. PATENT DOCUMENTS

2015/0124370 A1\* 5/2015 Ahn ....................... H01G 4/224
                                                          361/272
2017/0076864 A1\* 3/2017 Okai ........................ H01G 4/30
(Continued)

FOREIGN PATENT DOCUMENTS

CN          101001501 A  *  7/2007  ............... B32B 5/00
JP          49-6462 A       1/1974
(Continued)

OTHER PUBLICATIONS

Official Communication issued in corresponding Korean Patent Application No. 10-2020-0049110, dated May 20, 2021.
(Continued)

*Primary Examiner* — Timothy J Thompson
*Assistant Examiner* — Guillermo J Egoavil
(74) *Attorney, Agent, or Firm* — Keating & Bennett, LLP

(57) ABSTRACT

An electronic component assembly includes an electronic component and a mounting board. The electronic component includes a stacked body, a pair of external electrodes provided on both end surfaces of the stacked body, and an insulating layer entirely covering a first main surface of the stacked body. The mounting board includes a board main body having a mounting surface, and land electrodes on the mounting surface. The first main surface of the electronic component faces the mounting surface of the mounting board, and the pair of external electrodes are mounted on the land electrodes with solder. Both end portions of the insulating layer in the length direction of the electronic component are located on the outer side relative to both end surfaces of the stacked body at least in a cross section taken at the center in the width direction.

15 Claims, 13 Drawing Sheets

(51) Int. Cl.
*H01G 4/12* (2006.01)
*H01G 4/30* (2006.01)

(58) Field of Classification Search
CPC ............ H01G 4/30; H01G 4/12; H01G 4/005; H01G 4/228; H01G 4/252; H05K 1/181; H05K 2201/10015; H05K 2201/10636; H05K 2201/049; H05K 3/3442; Y02P 70/50
USPC ......... 361/301.4, 306.3, 321.4, 321.2, 321.5; 174/260
See application file for complete search history.

(56) References Cited

U.S. PATENT DOCUMENTS

| 2017/0076868 | A1 |   | 3/2017  | Noda et al. |           |
|--------------|----|---|---------|-------------|-----------|
| 2017/0207025 | A1 |   | 7/2017  | Kim et al.  |           |
| 2017/0256359 | A1 | * | 9/2017  | Masunari    | H01G 4/30 |
| 2017/0352482 | A1 | * | 12/2017 | Park        | H01G 4/30 |
| 2018/0144868 | A1 | * | 5/2018  | Park        | H05K 3/3442 |
| 2019/0131076 | A1 |   | 5/2019  | Fukumura    |           |
| 2019/0189338 | A1 | * | 6/2019  | Kim         | H01F 27/022 |

FOREIGN PATENT DOCUMENTS

| JP | 56-132734     | U |   | 10/1981 |           |
|----|---------------|---|---|---------|-----------|
| JP | 08-162357     | A |   | 6/1996  |           |
| JP | 08162357      | A | * | 6/1996  | H01G 2/06 |
| JP | 09-180957     | A |   | 7/1997  |           |
| JP | 2001-044069   | A |   | 2/2001  |           |
| JP | 2012-222124   | A |   | 11/2012 |           |
| JP | 2017-059631   | A |   | 3/2017  |           |
| KR | 10-2019-0049479 | A |   | 5/2019  |           |
| WO | WO-2017110614 | A1 | * | 6/2017 | H01L 23/373 |

OTHER PUBLICATIONS

Official Communication issued in corresponding Japanese Patent Application No. 2019-092147, dated Feb. 22, 2022.

* cited by examiner

ELECTRONIC COMPONENT ASSEMBLY AND METHOD FOR MANUFACTURING THE SAME

CROSS REFERENCE TO RELATED APPLICATIONS

This application claims the benefit of priority to Japanese Patent Application No. 2019-092147 filed on May 15, 2019. The entire contents of this application are hereby incorporated herein by reference.

BACKGROUND OF THE INVENTION

1. Field of the Invention

The present invention relates to an electronic component assembly and a method for manufacturing the same. In particular, the present invention relates to an electronic component assembly mounted on, for example, cellular telephones and digital cameras, and a method for manufacturing the same.

2. Description of the Related Art

A conventional multilayer ceramic capacitor includes a stacked body having ceramic outer layer sections adjacent to both main surfaces of the stacked body. Both end surfaces of the stacked body are covered with external electrodes, the external electrodes also covering the outer layer sections. When such a multilayer ceramic capacitor is mounted on a mounting board with solder, the application of a voltage to the multilayer ceramic capacitor may warp the board, thus causing cracks extending from the end of joint portions between the external electrodes and the solder.

Japanese Patent Laid-Open No. 9-180957 discloses a multilayer ceramic capacitor that addresses such cracks caused by warping. This multilayer ceramic capacitor has a dielectric ceramic having layered internal electrodes embedded therein. Both ends of the dielectric ceramic are covered with terminal electrodes (external electrodes). Each terminal electrode is composed of an underlying electrode, a Ni plating layer, and a Sn-containing plating layer. In this multilayer ceramic capacitor, the end portions of the terminal electrodes in contact with the dielectric ceramic are partially covered with electric insulating layers having low solder wettability.

However, such a multilayer ceramic capacitor, where the end portions of the terminal electrodes in contact with the dielectric ceramic are partially covered with the electric insulating layers, cannot maintain sufficient strength against stress applied to the multilayer ceramic capacitor and against the progress of cracks caused by the stress.

SUMMARY OF THE INVENTION

Preferred embodiments of the present invention provide electronic component assemblies that are each able to significantly increase the mechanical strength of an electronic component, and to provide methods for manufacturing the same.

An electronic component assembly according to a preferred embodiment of the present invention includes an electronic component and a mounting board. The electronic component includes a stacked body, a first external electrode, a second external electrode, and an insulating layer. The stacked body includes a plurality of stacked ceramic layers. The stacked body also includes a first main surface and a second main surface opposite to each other in a stacking direction, a first lateral surface and a second lateral surface opposite to each other in a width direction orthogonal or substantially orthogonal to the stacking direction, and a first end surface and a second end surface opposite to each other in a length direction orthogonal or substantially orthogonal to the stacking direction and the width direction. The first external electrode covers the first end surface, and extends from the first end surface to cover a portion of each of the first main surface, the second main surface, the first lateral surface, and the second lateral surface. The second external electrode covers the second end surface, and extends from the second end surface to cover a portion of each of the first main surface, the second main surface, the first lateral surface, and the second lateral surface. The insulating layer covers the first main surface of the stacked body, a portion of the first external electrode exposed at the first main surface, and a portion of the second external electrode exposed at the first main surface. The mounting board includes a board main body with a mounting surface, and a land electrode on the mounting surface. The first main surface of the electronic component faces the mounting surface of the mounting board. The first external electrode and the second external electrode are mounted on the land electrode with solder. Both end portions of the insulating layer in the length direction are located on an outer side relative to the first and second end surfaces of the stacked body at least in a cross section taken at a center in the width direction.

Preferred embodiments of the present invention provide electronic component assemblies that are each able to significantly increase the mechanical strength of an electronic component, and methods for manufacturing the same.

The above and other elements, features, steps, characteristics and advantages of the present invention will become more apparent from the following detailed description of the preferred embodiments with reference to the attached drawings.

BRIEF DESCRIPTION OF THE DRAWINGS

FIG. 8A is an enlarged cross-sectional view of a connection portion between the multilayer ceramic capacitor and a land electrode on the mounting board; FIG. 8B is a view showing a simulated stress acting on the multilayer ceramic capacitor and the land electrode when a voltage is applied to the multilayer ceramic capacitor mounted on the mounting board; and FIG. 8C is a view showing the state of stresses acting vertically and horizontally to the mounting board.

FIG. 9A is an enlarged cross-sectional view of a connection portion between the multilayer ceramic capacitor and a land electrode on the mounting board; FIG. 9B is a view showing the distribution of simulated stress acting on the multilayer ceramic capacitor and the land electrode when a voltage is applied to the multilayer ceramic capacitor mounted on the mounting board; and FIG. 9C is a view showing the state of stresses acting vertically and horizontally to the mounting board.

FIG. 10A is an enlarged cross-sectional view of a connection portion between the multilayer ceramic capacitor and a land electrode on the mounting board; FIG. 10B is a view showing the distribution of simulated stress acting on the multilayer ceramic capacitor and the land electrode when a voltage is applied to the multilayer ceramic capacitor mounted on the mounting board; and FIG. 10C is a view showing the state of stresses acting vertically and horizontally to the mounting board.

DETAILED DESCRIPTION OF THE PREFERRED EMBODIMENTS

An electronic component assembly in a first preferred embodiment of the present invention will now be described.

The present invention mainly relates to an electronic component assembly. In the following preferred embodiment of the present invention, an example multilayer ceramic capacitor (electronic component) included in an electronic component assembly and a method for manufacturing the same in a first preferred embodiment of the present invention are described, with reference to FIGS. 1 to 5.

Figure 1:
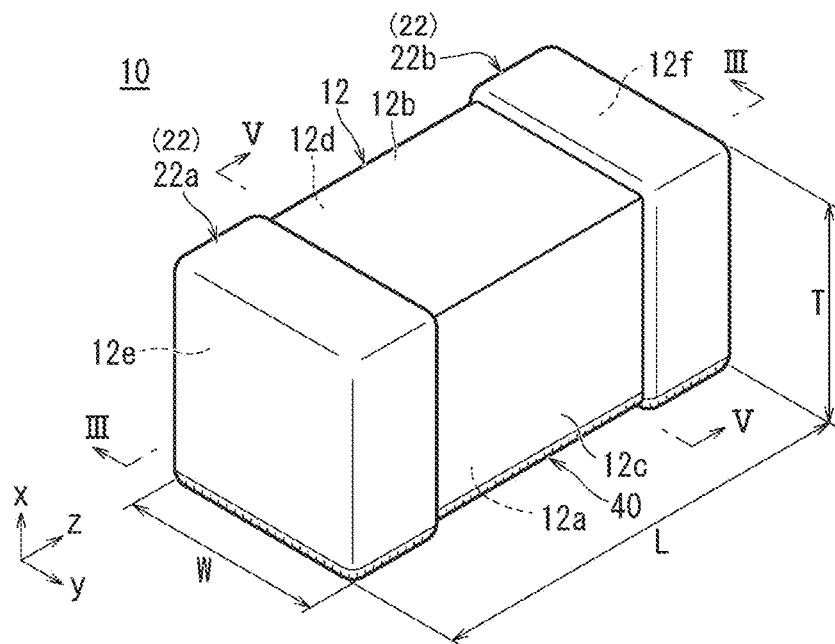
FIG. 1 is an outside perspective view of a multilayer ceramic capacitor included in an electronic component assembly in a first preferred embodiment of the present invention.
Figure 2:
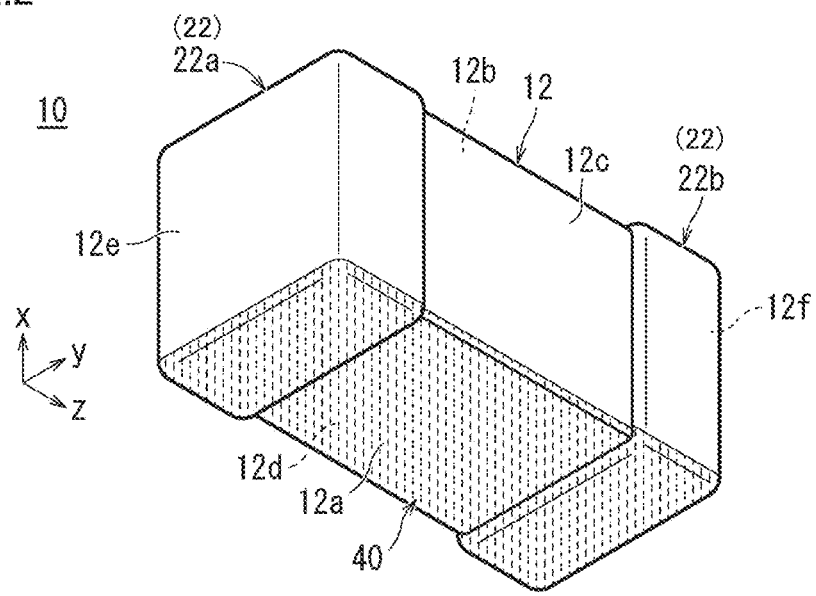
FIG. 2 is an outside perspective view of a multilayer ceramic capacitor included in an electronic component assembly in the first preferred embodiment of the present invention.
Figure 3:
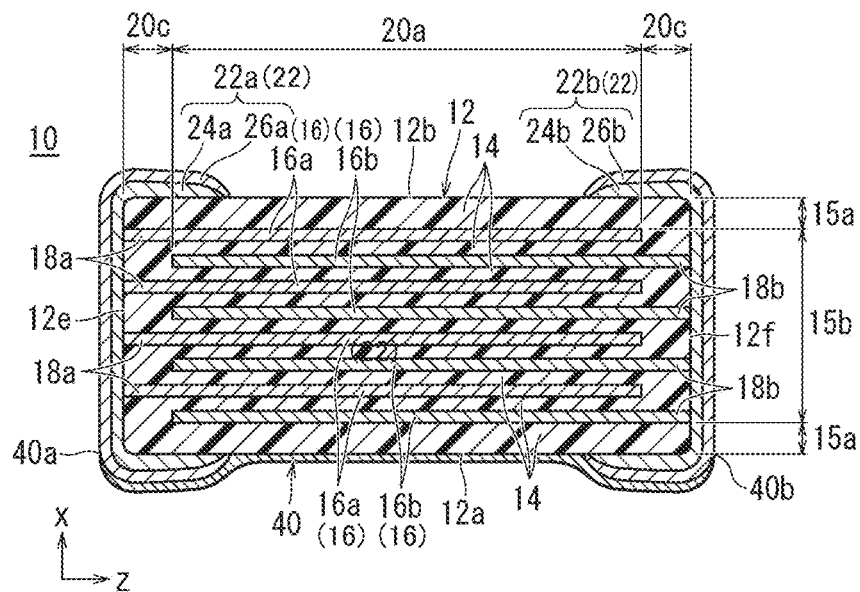
FIG. 3 is a cross-sectional view taken along line III-III shown in FIG. 1.
Figure 4:
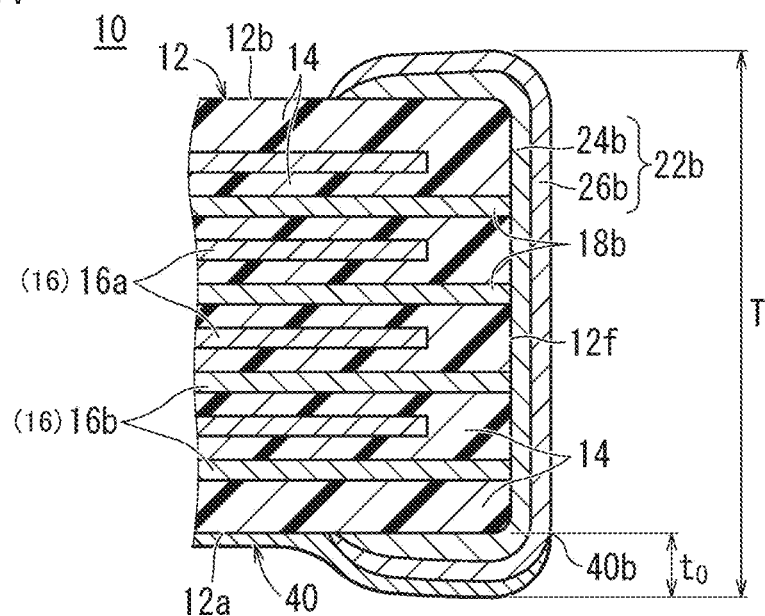
FIG. 4 is an enlarged cross-sectional view of the principal portion of the multilayer ceramic capacitor shown in FIG. 3.
Figure 5:
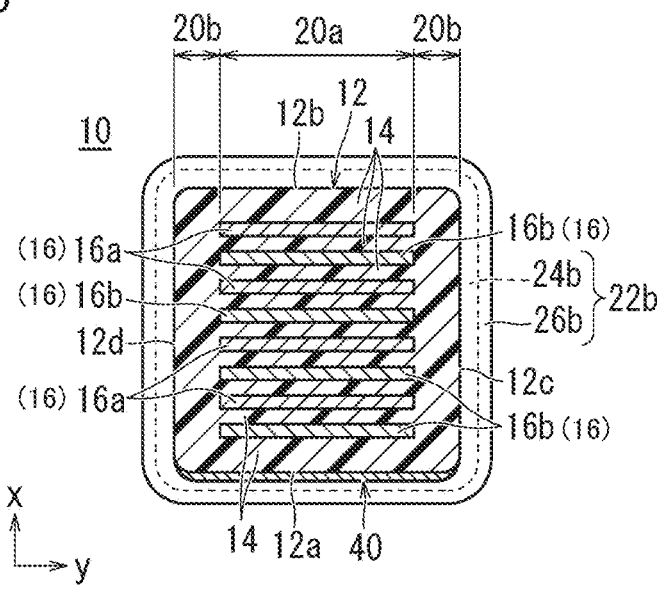
FIG. 5 is a cross-sectional view taken along line V-V shown in FIG. 1.

FIGS. 1 and 2 are outside perspective views of the multilayer ceramic capacitor included in the electronic component assembly in the first preferred embodiment of the present invention. FIG. 3 is a cross-sectional view taken along line shown in FIG. 1. FIG. 4 is an enlarged cross-sectional view of the principal portion of the multilayer ceramic capacitor shown in FIG. 3. FIG. 5 is a cross-sectional view taken along line V-V shown in FIG. 1.

As shown in, for example, FIGS. 1 to 5, a multilayer ceramic capacitor 10 includes, for example, a rectangular parallelepiped or substantially rectangular parallelepiped stacked body 12. Stacked body 12 includes a plurality of ceramic layers 14 and a plurality of internal electrode layers 16 which are stacked. Further, stacked body 12 includes a first main surface 12a and a second main surface 12b opposite to each other in a stacking direction x, a first lateral surface 12c and a second lateral surface 12d opposite to each other in a width direction y orthogonal or substantially orthogonal to stacking direction x, and a first end surface 12e and a second end surface 12f opposite to each other in a length direction z orthogonal or substantially orthogonal to stacking direction x and width direction y. The corners and ridge lines of stacked body 12 are preferably rounded, for example. Each corner refers to an intersection of adjacent three planes of the stacked body, and each ridge line refers to an intersection of adjacent two planes of the stacked body.

Ceramic layers 14 of stacked body 12 may preferably be made of a dielectric ceramic including, for example, $BaTiO_3$, $CaTiO_3$, $SrTiO_3$, Pb, ferrite beads, or $CaZrO_3$. With any of these dielectric materials included as a primary component, secondary components, less in content than the primary component, may be added. Examples of the secondary components include Mn compounds, Fe compounds, Cr compounds, Co compounds, and Ni compounds. The dimension of ceramic layers 14 in stacking direction x is preferably not less than about 0.3 μm and not more than about 5.0 μm, for example.

If a piezoelectric ceramic is provided as stacked body 12, the electronic component defines and functions as a ceramic piezoelectric element. Specific examples of piezoelectric ceramic materials include lead zirconate titanate (PZT) ceramic materials.

If a semiconductor ceramic is provided as stacked body 12, the electronic component defines and functions as a thermistor element. Specific examples of semiconductor ceramic materials include spinel ceramic materials.

If a magnetic ceramic is provided as stacked body 12, the electronic component defines and functions as an inductor element. If the electronic component defines and functions as an inductor element, internal electrode layers 16 define a coiled conductor. Specific examples of magnetic ceramic materials include ferrite ceramic materials.

Stacked body 12 includes outer layer sections 15a and an inner layer section 15b. Outer layer sections 15a each include a plurality of ceramic layers 14. Inner layer section 15b includes one or more ceramic layers 14 and a plurality of internal electrode layers 16 provided on ceramic layers 14. Outer layer sections 15a are located adjacent to or in a vicinity of first and second main surfaces 12a, 12b of stacked body 12. Specifically, one of outer layer sections 15a is a collection of a plurality of ceramic layers 14 located between first main surface 12a and internal electrode layer 16 that is closest to first main surface 12a, and the other of outer layer sections 15a is a collection of a plurality of ceramic layers 14 located between second main surface 12b and internal electrode layer 16 that is closest to second main surface 12b. The region sandwiched between both outer layer sections 15a is inner layer section 15b. Each outer layer section 15a preferably has a thickness of not less than about 10 μm and not more than about 300 μm, for example.

Stacked body 12 preferably has a dimension of, for example, not less than about 100 μm and not more than about 550 μm in stacking direction x, a dimension of not less than about 400 μm and not more than about 1250 μm in length direction z, and a dimension of not less than about 200 μm and not more than about 550 μm in width direction y. The number of ceramic layers 14 is preferably, for example, not less than about 100 and not more than about 1400, including outer layer sections 15a.

As shown in, for example, FIGS. 3 and 5, the plurality of internal electrode layers 16 in stacked body 12 include a plurality of first internal electrode layers 16a and a plurality of second internal electrode layers 16b, which are preferably, for example, rectangular or substantially rectangular. The plurality of first internal electrode layers 16a and the plurality of second internal electrode layers 16b are embedded in stacked body 12 and are alternated and equally or substantially equally spaced along stacking direction x of stacked body 12.

First internal electrode layers 16a include, at one end, leading electrode portions 18a leading to first end surface 12e of stacked body 12. Second internal electrode layers 16b include, at one end, leading electrode portions 18b leading to second end surface 12f of stacked body 12. Specifically, leading electrode portions 18a at one end of first internal electrode layers 16a are exposed at first end surface 12e of stacked body 12. Leading electrode portions 18b at one end of second internal electrode layers 16b are exposed at second end surface 12f of stacked body 12.

As shown in, for example, FIGS. 3 and 5, stacked body 12 includes an electrode facing section 20a where first internal electrode layers 16a and second internal electrode layers 16b face each other in inner layer section 15b of ceramic layers 14. Stacked body 12 also includes lateral portions (hereinafter referred to as "W gaps") 20b of stacked body 12 defined by first lateral surface 12c and one end of electrode facing section 20a in width direction y, and defined by second lateral surface 12d and the other end of electrode facing section 20a in width direction y. Stacked body 12 further includes end portions (hereinafter referred to as "L gaps") 20c of stacked body 12 defined by second end surface 12f and the end of first internal electrode layers 16a opposite to leading electrode portions 18a, and defined by first end surface 12e and the end of second internal electrode layers 16b opposite to leading electrode portions 18b. Each L gap 20c (end portion) of stacked body 12 preferably has a length of not less than about 20 μm and not more than about 40 μm, for example. Each W gap 20b (lateral portion) of stacked body 12 preferably has a length of not less than about 15 μm and not more than about 20 μm, for example.

As shown in, for example, FIGS. 3 and 5, in stacked body 12, first internal electrode layers 16a and second internal electrode layers 16b face each other in electrode facing section 20a, with ceramic layers 14 being interposed between the first internal electrode layers 16a and the second internal electrode layers 16b, thus causing capacitance. This provides a capacitance between first external electrode 22a, to which first internal electrode layers 16a are electrically connected, and second external electrode 22b, to which second internal electrode layers 16b are electrically connected. Accordingly, the multilayer ceramic electronic component defines and functions as a capacitor.

Internal electrode layers 16 include metal, for example, Ni, Cu, or Ag. Internal electrode layers 16 may further include dielectric particles having the same or similar composition as the ceramic included in ceramic layers 14. Each internal electrode layer 16 preferably has a thickness of not less than about 0.1 μm and not more than about 3.0 μm, for example.

External electrodes 22 are provided on first and second end surfaces 12e, 12f of stacked body 12. External electrodes 22 include first external electrode 22a and second external electrode 22b.

First external electrode 22a is provided on first end surface 12e of stacked body 12. First external electrode 22a covers first end surface 12e of stacked body 12, and extends from first end surface 12e to cover a portion of each of first main surface 12a, second main surface 12b, first lateral surface 12c, and second lateral surface 12d. Accordingly, first external electrode 22a is electrically connected to leading electrode portions 18a of first internal electrode layers 16a.

Second external electrode 22b is provided on second end surface 12f of stacked body 12. Second external electrode 22b covers second end surface 12f of stacked body 12, and extends from second end surface 12f to cover a portion of each of first main surface 12a, second main surface 12b, first lateral surface 12c, and second lateral surface 12d. Accordingly, second external electrode 22b is electrically connected to leading electrode portions 18b of second internal electrode layers 16b.

As shown in FIG. 3, first external electrode 22a includes an underlying electrode layer 24a and a plating layer 26a, in this order from the stacked body 12 side. Similarly, second external electrode 22b includes an underlying electrode layer 24b and a plating layer 26b, in this order from the stacked body 12 side.

Each of underlying electrode layers 24a and 24b preferably includes at least one selected from, for example, a baked layer, a resin layer, and a thin film layer. The baked layer includes, for example, a Si-containing glass and Cu as a metal. Examples of the metal for baked layer include at least one selected from Cu, Ni, Ag, Pd, Ag—Pd alloy, and Au. The baked layer is produced by applying a conductive paste including glass and metal to stacked body 12 and then baking it. The baking may be performed simultaneously with the firing of internal electrode layers 16, or may be performed after the firing of ceramic layers 14 and internal electrode layers 16. The baked layer may include a plurality of layers. The thickest portion of the baked layer preferably has a thickness of not less than about 10 μm and not more than about 50 μm, for example.

The resin layer may be provided on the baked layer, or may be directly formed on stacked body 12 with no baked layer interposed between the resin layer and the stacked body 12. The resin layer may include a plurality of layers. If the resin layer is provided on the baked layer, the resin layer may include, for example, conductive particles and a thermosetting resin. The thickest portion of the resin layer preferably has a thickness of not less than about 5 μm and not more than about 50 μm, for example.

The thin film layer is a deposit of metal particles preferably having a thickness of about 1 μm or less, for example, formed by any of thin-film formation techniques, for example, sputtering or vapor deposition.

Plating layers 26a and 26b may include, for example, at least one selected from Cu, Ni, Sn, Ag, Pd, Ag—Pd alloy, and Au.

Each of plating layers 26a and 26b may include a plurality of layers. Preferably, for example, each of plating layers 26a and 26b has a double-layer structure including a Ni plating layer provided on the baked layer, and a Sn plating layer provided on the Ni plating layer. The purpose of the Ni plating layer is to prevent underlying electrode layers 24a and 24b from being eroded by solder at the time of mounting of multilayer ceramic capacitor 10. The Sn plating layer significantly increases the solder wettability during mounting of multilayer ceramic capacitor 10. Each plating layer preferably has a thickness of not less than about 0.1 μm and not more than about 5.0 μm, for example.

If each external electrode 22 includes a plating layer, external electrode 22 is directly provided on stacked body 12 and directly connected to internal electrode layers 16. Accordingly, a catalyst may be applied to stacked body 12 as a pretreatment. The plating layer preferably includes, for example, a first plating layer and a second plating layer provided on the first plating layer. Each of the first and second plating layers preferably includes, for example, at least one metal selected from, for example, Cu, Ni, Sn, Pb, Au, Ag, Pd, Bi, and Zn; or an alloy including any of these metals. For example, if the internal electrodes are made of Ni, the first plating layer is preferably made of Cu, which has good bondability to Ni. The second plating layer is preferably made of, for example, Sn or Au, which has good solder wettability. The first plating layer is preferably made of Ni, for example, which is able to define and function as a barrier against solder.

The second plating layer is optional, that is, each external electrode 22 may include only the first plating layer. The second plating layer may be an outermost plating layer, or another plating layer may be additionally provided on the second plating layer. Each plating layer preferably has a thickness of not less than about 1 μm and not more than about 10 μm, for example. The plating layer is preferably free from glass, for example. The percentage of metal in the plating layer per unit volume is preferably, for example, about 99 vol % or more. The plating layer, which is formed by grain growth along its thickness direction, has a columnar shape.

An insulating layer 40 is provided entirely or substantially entirely over first main surface 12a, including first and second external electrodes 22a and 22b exposed at first main surface 12a of stacked body 12.

That is, multilayer ceramic capacitor 10 includes insulating layer 40 extending over the portion of the surface of first external electrode 22a located on first main surface 12a of stacked body 12, the portion of first main surface 12a located between first and second external electrodes 22a and 22b, and the portion of the surface of second external electrode 22b located on first main surface 12a of stacked body 12. Both end portions 40a, 40b of insulating layer 40 in length direction z of multilayer ceramic capacitor 10 are located on the outer side relative to both end surfaces 12e, 12f of stacked body 12 (i.e., on the side away from both end surfaces 12e, 12f of stacked body 12 along length direction z of stacked body 12) at least in a cross section taken at the center in width direction y, as seen in width direction y.

Insulating layer 40, provided entirely or substantially entirely over first main surface 12a including first and second external electrodes 22a and 22b exposed at first main surface 12a of stacked body 12, is able to significantly reduce or prevent short circuits that would be caused by ion migration between first and second external electrodes 22a and 22b.

Insulating layer 40 may be made of ceramic, for example. If insulating layer 40 is made of ceramic, it preferably includes at least one selected from, for example, $Al_2O_3$, PZT, SiC, and MgO. Insulating layer 40, if made of ceramic, is able to significantly increase the mechanical strength against stress on multilayer ceramic capacitor 10. If insulating layer 40 is made of ceramic, the ceramic included in insulating layer 40 is preferably smaller in grain size than the ceramic included in ceramic layers 14.

If insulating layer 40 is made of resin, it may preferably include, for example, at least one of epoxy resin, silicone resin, fluorine resin, phenolic resin, urea resin, melamine resin, unsaturated polyester resin, barium titanate, alumina, silica, yttria, and zirconia. Among these, particularly preferred are materials that are able to be used for solder masks with metal oxide for a printed circuit board, for example, thermosetting epoxy resin, silicone resin, fluorine resin, phenolic resin, melamine resin, barium titanate, alumina, and silica.

Insulating layer 40 may be directly applied to plating layers 26a, 26b and first main surface 12a. Insulating layer 40 preferably has a thickness of about 5 μm or less, for example. With insulating layer 40 having a thickness of about 5 μm or less, multilayer ceramic capacitor 10 is able to be stably mounted on a mounting board. The thickness of insulating layer 40 is able to be determined at the center or approximate center of a cross section taken at the center or approximate center in width direction y, with about 10000 times magnification using a SEM. Specifically, the thickness is able to be determined as the average thickness of the three points: the center or approximate center of external electrode 22a in length direction z, the center or approximate center of external electrode 22b in length direction z, and the center or approximate center of stacked body 12.

The boundary between stacked body 12 and insulating layer 40 is able to be determined using energy dispersive X-ray spectroscopy (EDX). If ceramic layers 14 in stacked body 12 and insulating layer 40 have the same or similar composition, the boundary is able to be determined by observing with, for example, a focused ion beam scanning electron microscope (FIB-SEM). The observation will show that ceramic layers 14 in stacked body 12 are higher in void ratio than insulating layer 40.

Insulating layer 40 preferably has a filling ratio of about 90% or more in a cross section taken at the center in width direction y of stacked body 12, for example. With insulating layer 40 having a filling ratio of about 90% or more, mechanical strength of multilayer ceramic capacitor 10 is able to be significantly increased.

The filling ratio of insulating layer 40 is calculated as follows. First, a cross section of multilayer ceramic capacitor 10 is exposed. The cross section is taken at the center or approximate center of multilayer ceramic capacitor 10 in width direction y, the cross section including length direction z and stacking direction x of stacked body 12 (the cross section is hereinafter referred to as an "LT cross section"). Multilayer ceramic capacitor 10 with the exposed cross section is then polished. The LT cross section is observed with a focused ion beam scanning electron microscope (FIB-SEM), so that the amount of void is able to be determined. Specifically, an image in a predetermined field of view is divided into a void region and the other region through image processing. Then, the ratio of the region other than the void region to the entire image in the field of view is calculated. Thus, the filling ratio is calculated.

A condition of $t_0/T \leq$ about 0.1 is preferably satisfied, where T denotes the dimension of multilayer ceramic capacitor 10 in stacking direction x, and $t_0$ denotes the dimension of insulating layer 40 in stacking direction x at its end surface, for example. Multilayer ceramic capacitor 10, satisfying this condition, is able to be significantly increased in its mountability on a mounting board.

Figure 6:
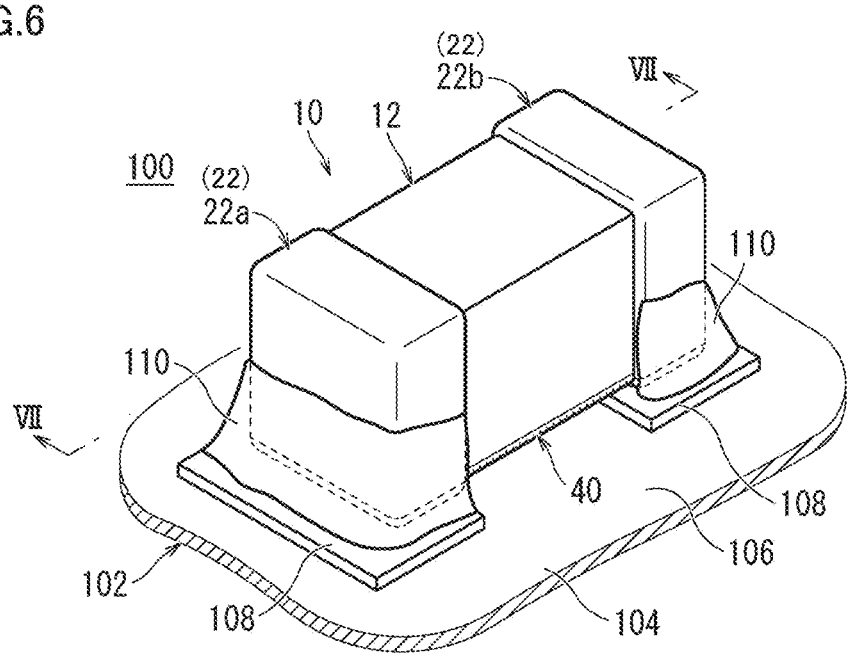
FIG. 6 is a perspective view of the principal portion of the electronic component assembly in the first preferred embodiment of the present invention.
Figure 7:
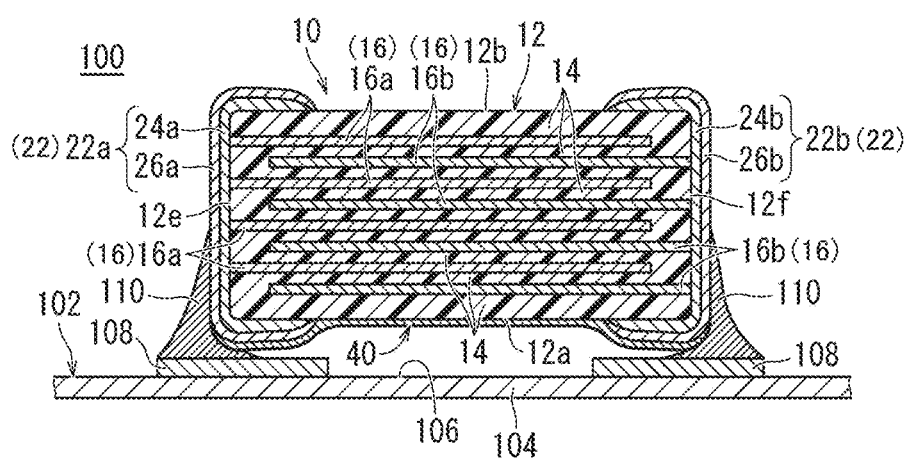
FIG. 7 is a cross-sectional view taken along line VII-VII shown in FIG. 6.

A multilayer ceramic capacitor assembly 100 with the above-described multilayer ceramic capacitor will now be described with reference to, for example, FIGS. 6 and 7, in particular. FIG. 6 is a perspective view of the principal portion of the electronic component assembly in the first preferred embodiment of the present invention. FIG. 7 is a cross-sectional view taken along line VII-VII shown in FIG. 6.

As shown in, for example, FIGS. 6 and 7, multilayer ceramic capacitor assembly 100 includes multilayer ceramic capacitor 10 and a mounting board 102. Mounting board 102 includes a board main body 104. Board main body 104 is preferably made of, for example, resin (e.g., glass epoxy) or ceramic (e.g., glass ceramic). Board main body 104 may include, for example, a stack of a plurality of insulator layers. One of the main surfaces of board main body 104 includes a mounting surface 106. Mounting surface 106 includes land electrodes 108 thereon which are, for example, rectangular or substantially rectangular in planar view. First and second external electrodes 22a and 22b are connected to and fixed to land electrodes 108 with, for example, solder 110, thus allowing multilayer ceramic capacitor 10 to be mounted. Accordingly, first and second external electrodes 22a and 22b located on first main surface 12a of stacked body 12 align with land electrodes 108.

As shown in FIG. 7, multilayer ceramic capacitor assembly 100 includes a space including no solder 110 and defined by land electrodes 108 and insulating layer 40 on first and second external electrodes 22a and 22b exposed at first main surface 12a of stacked body 12. The space lies on the side of multilayer ceramic capacitor 10 adjacent to the mounting surface.

With reference to FIGS. 8A-8C to 10A-10C, a simulated stress is described that acts on the multilayer ceramic capacitor and each land electrode when a voltage is applied to the multilayer ceramic capacitor mounted on the mounting board.

Figure 8A:
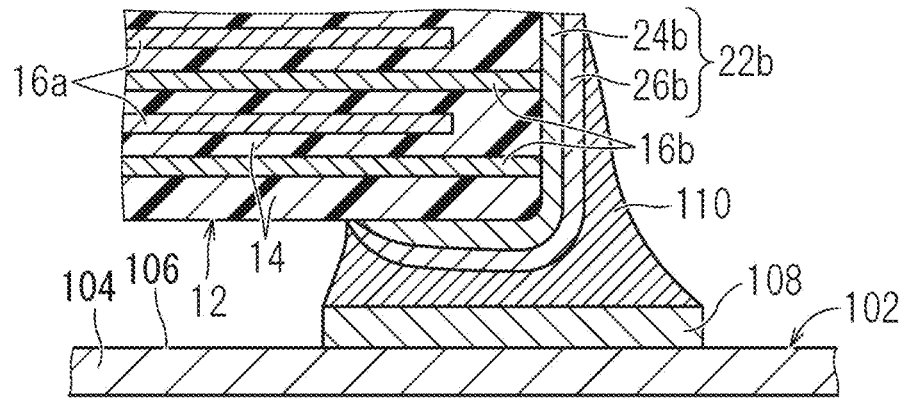
FIGS. 8A to 8C are different views of a multilayer ceramic capacitor mounted on a mounting board, where the multilayer ceramic capacitor includes no insulating layer. Specifically.
Figure 8B:
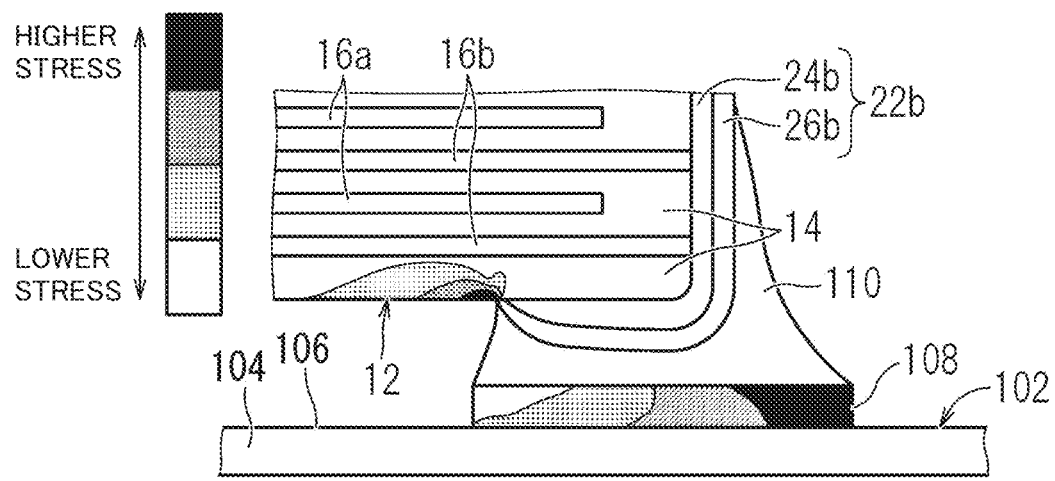
Figure 8C:
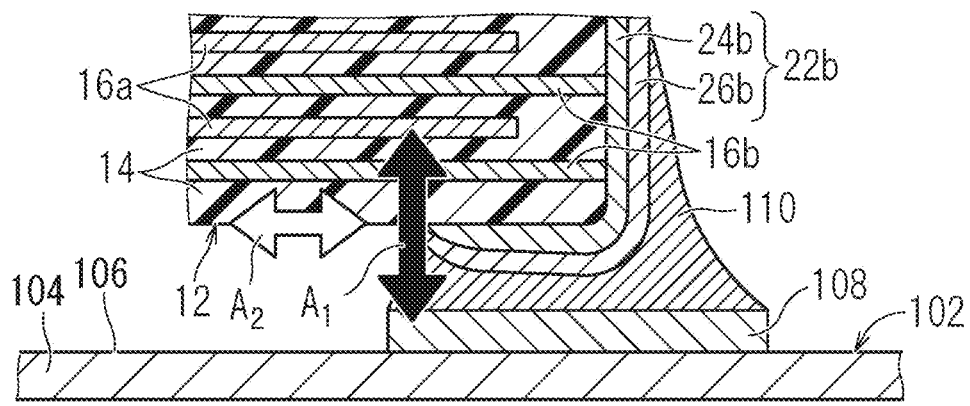

FIGS. 8A to 8C are different views of the multilayer ceramic capacitor mounted on the mounting board, where the multilayer ceramic capacitor includes no insulating layer. Specifically, FIG. 8A is an enlarged cross-sectional view of a connection portion between the multilayer ceramic capacitor and a land electrode on the mounting board; FIG. 8B is a view showing a simulated stress acting on the multilayer ceramic capacitor and the land electrode when a voltage is applied to the multilayer ceramic capacitor mounted on the mounting board; and FIG. 8C is a view showing the state of stresses acting vertically and horizontally to the mounting board.

Figure 9A:
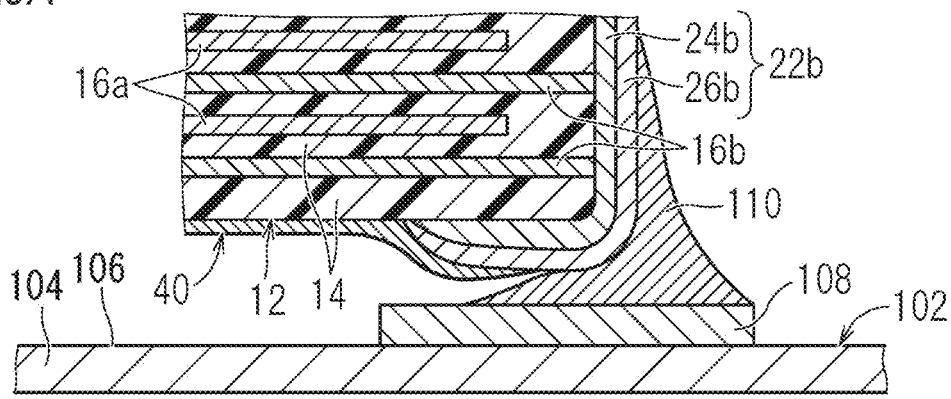
FIGS. 9A to 9C are different views of a multilayer ceramic capacitor mounted on a mounting board, where the multilayer ceramic capacitor includes an insulating layer extending to the center or approximate center of the external electrodes located on both main surfaces and both lateral surfaces. Specifically.
Figure 9B:
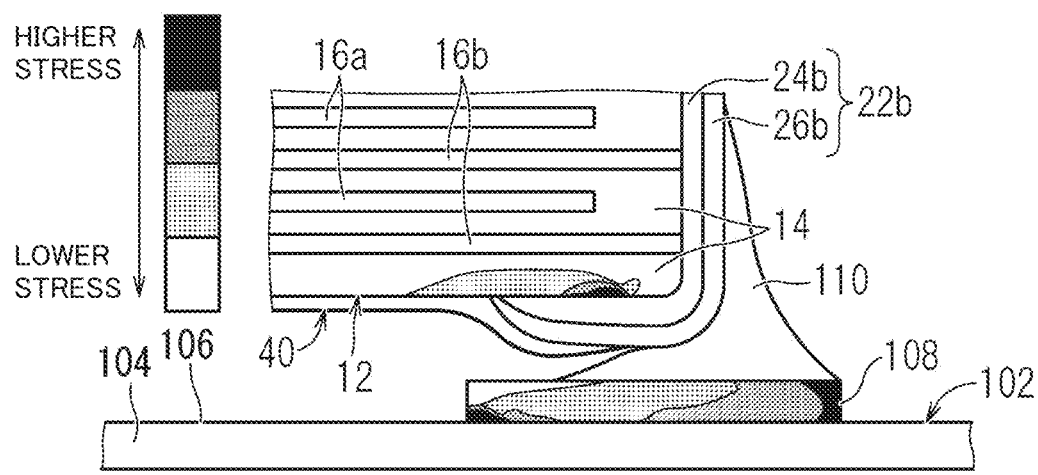
Figure 9C:
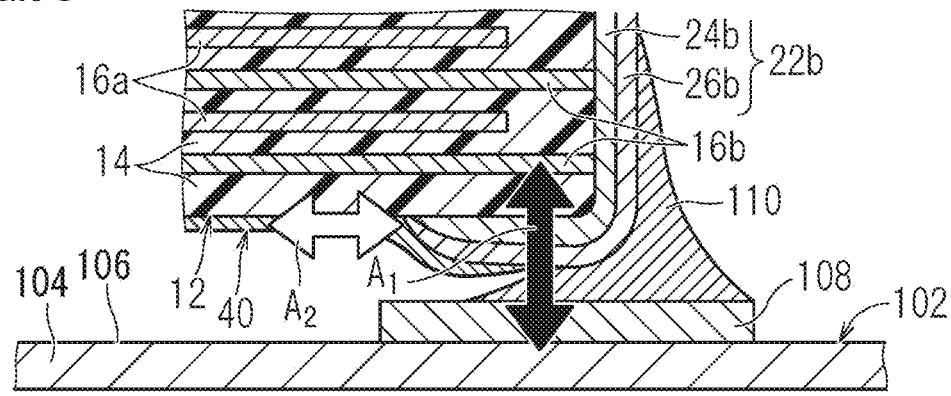

FIGS. 9A to 9C are different views of the multilayer ceramic capacitor mounted on the mounting board, where the multilayer ceramic capacitor includes an insulating layer extending to the center or approximate center of the external electrodes located on both main surfaces and both lateral surfaces. Specifically, FIG. 9A is an enlarged cross-sectional view of a connection portion between the multilayer ceramic capacitor and a land electrode on the mounting board; FIG. 9B is a view showing the distribution of simulated stress acting on the multilayer ceramic capacitor and the land electrode when a voltage is applied to the multilayer ceramic capacitor mounted on the mounting board; and FIG. 9C is a view showing the state of stresses acting vertically and horizontally to the mounting board.

Figure 10A:
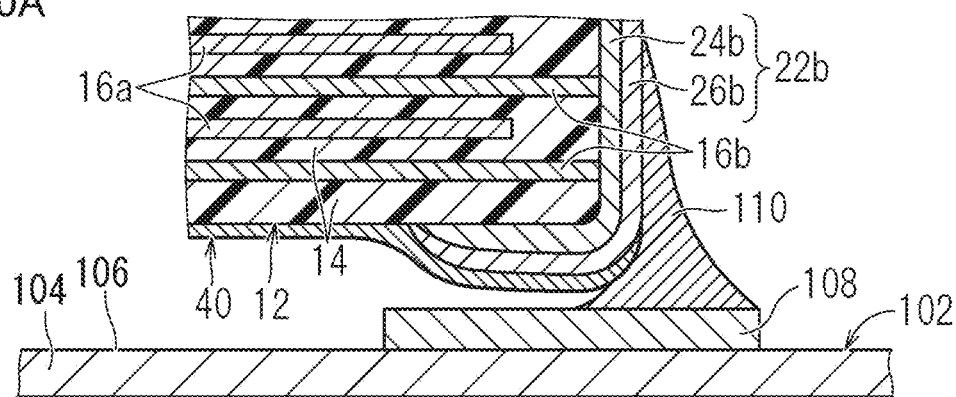
FIGS. 10A to 10C are different views of the multilayer ceramic capacitor of FIG. 1 mounted on a mounting board. Specifically.
Figure 10B:
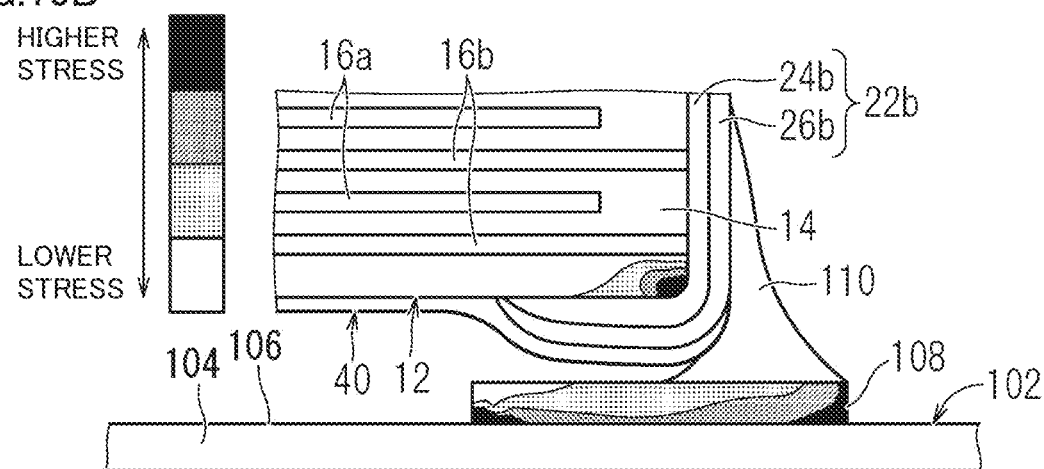
Figure 10C:
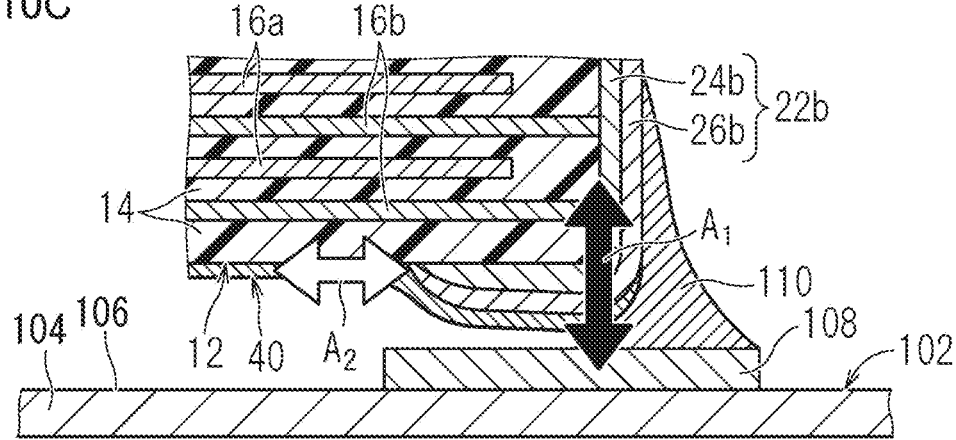

FIGS. 10A to 10C are different views of the multilayer ceramic capacitor of FIG. 1 mounted on the mounting board. Specifically, FIG. 10A is an enlarged cross-sectional view of a connection portion between the multilayer ceramic capacitor and a land electrode on the mounting board; FIG. 10B is a view showing the distribution of simulated stress acting on the multilayer ceramic capacitor and the land electrode when a voltage is applied to the multilayer ceramic capacitor mounted on the mounting board; and FIG. 10C is a view showing the state of stresses acting vertically and horizontally to the mounting board.

First, a description is provided regarding the distribution of simulated stress acting on the multilayer ceramic capacitor and the land electrode when a voltage is applied to the multilayer ceramic capacitor.

As shown in FIG. 8B, a stress concentrates on a portion of stacked body 12 at the boundary between solder 110 and external electrode 22b located on the main surface. Note that the boundary corresponds to an e-dimension end.

Also, as shown in FIG. 9B, a stress concentrates on a portion of stacked body 12 at the boundary between solder 110 and external electrode 22b located on the main surface. As shown in FIG. 9B, the stress concentration location in stacked body 12 falls within a portion covered with external electrode 22b. Thus, the stress at the e-dimension end in FIG. 9B is significantly reduced as compared with FIG. 8B.

Further, as shown in FIG. 10B, a stress concentrates on a portion of stacked body 12 at the boundary between solder 110 and external electrode 22b located on the main surface. As shown in FIG. 10B, the stress concentration location in stacked body 12 falls within a portion covered with external electrode 22b. Thus, the stress at the e-dimension end in FIG. 10B is further significantly reduced as compared with FIGS. 8B and 9B.

Next, the state of stresses acting vertically and horizontally to the mounting board is described.

FIGS. 8C, 9C, and 10C show a stress A1 acting vertically to the mounting board and a stress A2 acting horizontally to the mounting board. Referring to FIGS. 8C, 9C, and 10C in this order, the location of vertically acting stress A1 shifts in accordance with the difference in location of the boundary between solder 110 and external electrode 22b located on the main surface.

In multilayer ceramic capacitor assembly 100 shown in FIG. 6, multilayer ceramic capacitor 10 includes insulating layer 40, as described with reference to FIGS. 1 to 5. Specifically, insulating layer 40 extends entirely or substantially entirely over first main surface 12a, including first and second external electrodes 22a and 22b exposed at first main surface 12a of stacked body 12. Further, both end portions of insulating layer 40 in length direction z of multilayer ceramic capacitor 10 is located on the outer side relative to both end surfaces of stacked body 12 at least in a cross section taken at the center in width direction y. Thus, multilayer ceramic capacitor 10 is able to be significantly increased in mechanical strength against stress.

Multilayer ceramic capacitor assembly 100 shown in FIG. 6 includes a space where solder 110 and insulating layer 40 are not in contact with each other, the space being defined by land electrodes 108 and insulating layer 40 on first and second external electrodes 22a and 22b exposed at first main surface 12a of stacked body 12. The space lies on the side of multilayer ceramic capacitor 10 adjacent to the mounting surface. Accordingly, when a voltage is applied to multilayer ceramic capacitor 10, the location subjected to stress falls within a portion covered with external electrode 22*b*, and cracks at the connection portions between multilayer ceramic capacitor 10 and land electrodes 108 are able to be significantly reduced or prevented, thus significantly increasing the reliability in connection between multilayer ceramic capacitor 10 and land electrodes 108.

Next, example processes for manufacturing this multilayer ceramic capacitor assembly are described. First, example processes for manufacturing the multilayer ceramic capacitor are described.

(1) First, dielectric sheets and a conductive paste for internal electrodes are prepared. The dielectric sheets and the conductive paste for internal electrodes include binders and solvents, which may be any of publicly known organic binders and organic solvents.

(2) Next, the dielectric sheets are printed with the conductive paste for internal electrodes in predetermined pattern by, for example, screen printing or gravure printing, to form internal electrode patterns.

(3) Then, a predetermined number of dielectric sheets with no internal electrode pattern are stacked for an outer layer. On these sheets, dielectric sheets with the internal electrode printed thereon are stacked one after another. Further, a predetermined number of dielectric sheets for an outer layer are stacked. Thus, a sheet stack is produced.

(4) The sheet stack is then pressed in the stacking direction by, for example, isostatic press, thus producing a multilayer block.

(5) Then, the multilayer block is cut into pieces having a predetermined size, thus producing multilayer chips. At this time, the corners and ridge lines of the multilayer chips may be rounded by, for example, barrel polishing.

(6) Further, the multilayer chips are fired, thus producing stacked bodies 12. The firing temperature is preferably not less than about 900° C. and not more than about 1300° C., for example, according to the materials of the dielectric and internal electrodes.

(7) Then, a conductive paste for external electrodes is applied to both end surfaces of each stacked body 12 and is then baked, thus producing a baked layer for external electrodes. The baking temperature is preferably not less than about 700° C. and not more than about 900° C., for example.

(8) Further, the baked layer, including the conductive paste for external electrodes, may be plated.

The plating electrode may be directly formed on the surface of the stacked body, with no baked layer. Accordingly, the following processes (7') and (8') replace the above-described processes (7) and (8).

(7') Both end surfaces of stacked body 12 are plated, thus producing an underlying plating film on the exposed portions of the internal electrodes. Any one of electrolytic plating and electroless plating, for example, may be employed for plating. However, electrolytic plating is typically preferred, since electroless plating would require a pretreatment with a catalyst to increase the rate of plating deposition and thus involves complication of the process. As a plating technique, barrel plating is preferably applied, for example.

If a surface conductor is formed, a surface conductor pattern may be printed beforehand on each of the ceramic green sheets for outermost layers and may be fired simultaneously with the firing of the ceramic element. Alternatively, a surface conductor may be printed and then baked on the main surfaces of the ceramic element after the ceramic element has been fired.

(8') Then, a plating layer may be formed on the surface of the plating electrode for external electrodes.

Through these processes, a multilayer ceramic capacitor body is manufactured.

Next, insulating layer 40 is provided on the multilayer ceramic capacitor body.

If insulating layer 40 is made of ceramic, an aerosol deposition (AD) method is used, for example. Specifically, to form insulating layer 40, a carrier gas and materials of the insulating film are mixed in an aerosol generator, and the mixture is delivered as an aerosol from the aerosol generator to a pipe and guided to a nozzle at the end of the pipe. From this nozzle, the aerosol is thermal-sprayed to the first main surface of the multilayer ceramic capacitor body. This causes fine particles of the materials of insulating layer 40 to collide with the first main surface of the multilayer ceramic capacitor body into finer particles, thus forming insulating layer 40. Instead of the AD method, other methods may be employed to form insulating layer 40, for example, thermal spraying (e.g., cold spraying) or chemical-vapor deposition (CVD).

If the insulating layer includes resin, an atomizer or dipping device, for example may form the insulating layer. Alternatively, the insulating layer may be provided by being attached.

Then, insulating layer 40 is fixed to the multilayer ceramic capacitor body by thermal curing or drying, according to the physical properties of the insulating material.

In this way, multilayer ceramic capacitor 10 is manufactured.

Subsequently, the manufactured multilayer ceramic capacitor 10 is placed and mounted on mounting board 102, in such a way that first main surface 12*a* of multilayer ceramic capacitor 10 faces mounting board 102 including land electrodes 108 thereon.

According to the method for manufacturing a multilayer ceramic capacitor assembly in the first preferred embodiment, multilayer ceramic capacitor 10 includes insulating layer 40 as described with reference to FIGS. 1 to 5. Insulating layer 40 extends entirely or substantially entirely over first main surface 12*a*, including first and second external electrodes 22*a* and 22*b* exposed at first main surface 12*a* of stacked body 12. Further, both end portions of insulating layer 40 in length direction z of multilayer ceramic capacitor 10 is located on the outer side relative to both end surfaces of stacked body 12 at least in a cross section taken at the center in width direction y. Thus, the method is able to manufacture multilayer ceramic capacitor assembly 100 with multilayer ceramic capacitor 10 having a significantly increased mechanical strength against stress.

Further, according to the method for manufacturing a multilayer ceramic capacitor assembly in the first preferred embodiment, an aerosol deposition (AD) method may form ceramic insulating layer 40. Accordingly, the Sn plating layer at the outermost of each external electrode 22 does not easily melt and thus is able to be formed as a thin film. Further, the density of insulating layer 40 is improved.

Next, an electronic component assembly in a second preferred embodiment of the present invention is described.

Figure 11:
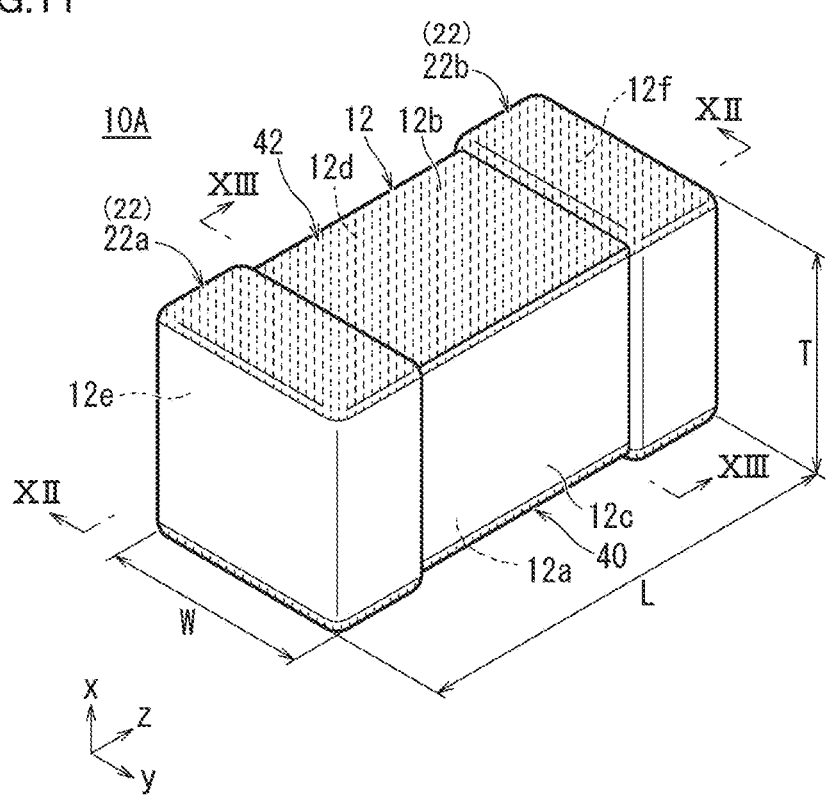
FIG. 11 is an outside perspective view of a multilayer ceramic capacitor included in an electronic component assembly in a second preferred embodiment of the present invention.
Figure 12:
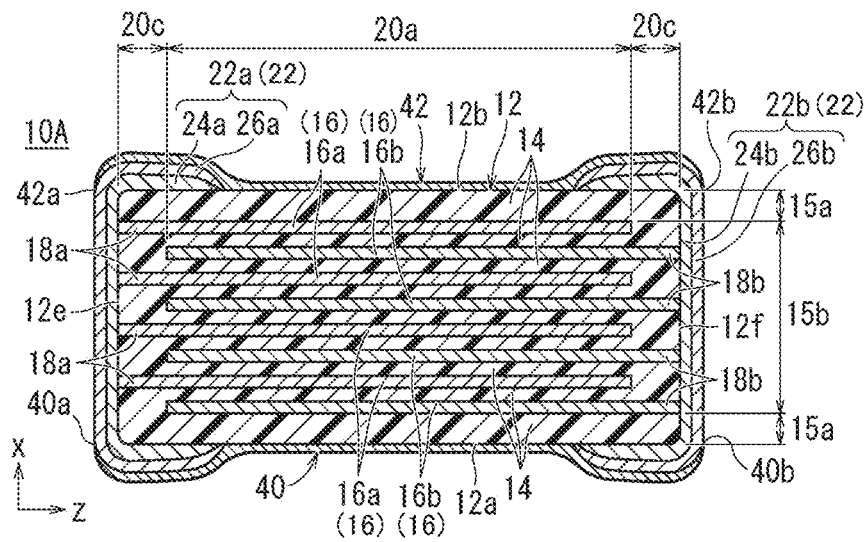
FIG. 12 is a cross-sectional view taken along line XII-XII shown in FIG. 11.
Figure 13:
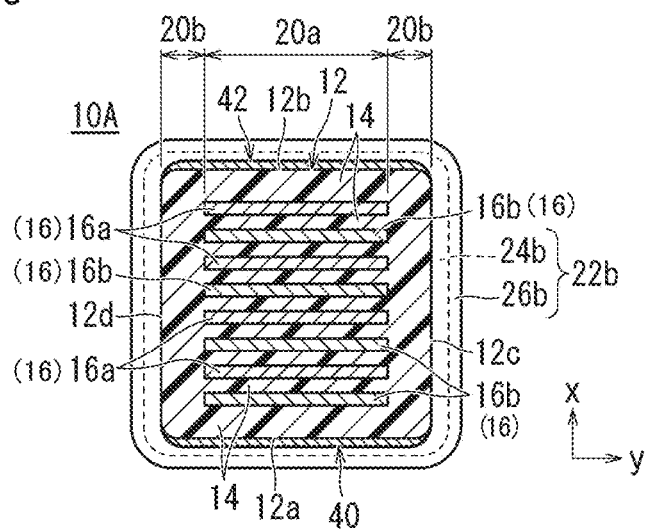
FIG. 13 is a cross-sectional view taken along line XIII-XIII shown in FIG. 11.

First, with reference to FIGS. 11 to 13, an example multilayer ceramic capacitor included in an electronic component assembly in the second preferred embodiment of the present invention is described. Also, with reference to FIGS.

14 and 15, an example multilayer ceramic capacitor assembly including the multilayer ceramic capacitor (electronic component) is described.

FIG. 11 is an outside perspective view of the multilayer ceramic capacitor included in the electronic component assembly in the second preferred embodiment of the present invention. FIG. 12 is a cross-sectional view taken along line XII-XII shown in FIG. 11. FIG. 13 is a cross-sectional view taken along line XIII-XIII shown in FIG. 11.

Figure 14:
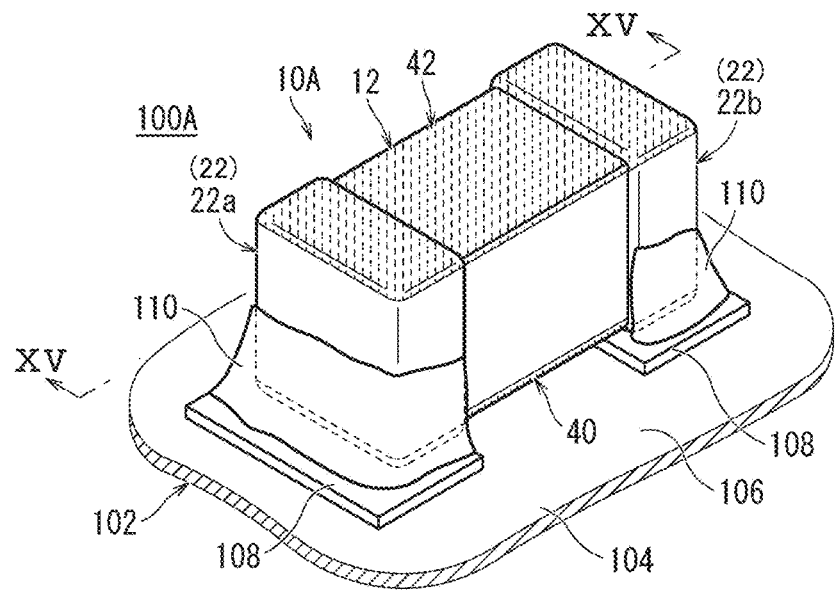
FIG. 14 is a perspective view of the principal portion of the electronic component assembly in the second preferred embodiment of the present invention.
Figure 15:
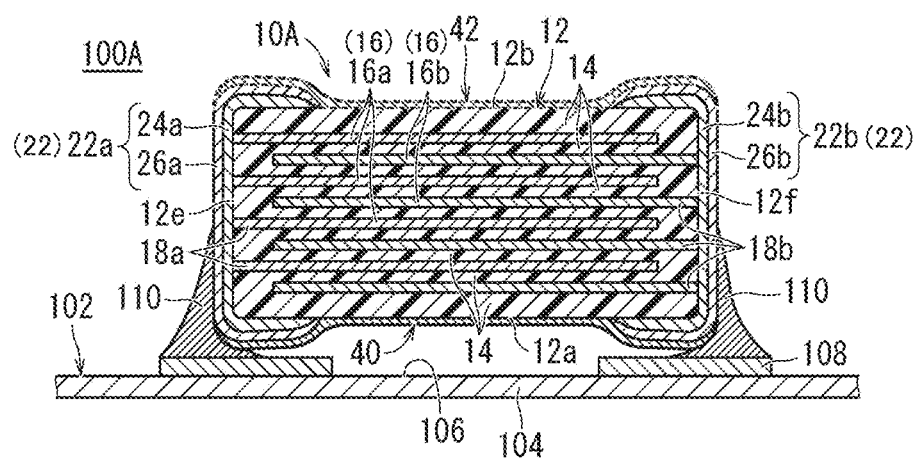
FIG. 15 is a cross-sectional view taken along line XV-XV shown in FIG. 14.

FIG. 14 is a perspective view of the principal portion of the electronic component assembly in the second preferred embodiment of the present invention. FIG. 15 is a cross-sectional view taken along line XV-XV shown in FIG. 14.

A multilayer ceramic capacitor 10A shown in FIG. 11 is similar to multilayer ceramic capacitor 10 described with reference to FIGS. 1 to 5, except that multilayer ceramic capacitor 10A includes an insulating layer not only on first main surface 12a of stacked body 12 but also on second main surface 12b. The portions the same or substantially the same as those of multilayer ceramic capacitor 10 shown in FIGS. 1 to 5 are identically denoted, and the description thereof is omitted.

Multilayer ceramic capacitor 10A includes insulating layer 40 extending entirely or substantially entirely over first main surface 12a of stacked body 12, and includes an insulating layer 42 extending entirely or substantially entirely over second main surface 12b of stacked body 12.

That is, as shown in FIGS. 11 to 13, multilayer ceramic capacitor 10A includes insulating layer 40 extending over the portion of the surface of first external electrode 22a located on first main surface 12a of stacked body 12, the portion of first main surface 12a located between first and second external electrodes 22a and 22b, and the portion of the surface of second external electrode 22b located on first main surface 12a of stacked body 12. Both end portions 40a, 40b of insulating layer 40 in length direction z of multilayer ceramic capacitor 10A are located on the outer side relative to both end surfaces 12e, 12f of stacked body 12 (i.e., on the side away from both end surfaces 12e, 12f of stacked body 12 along length direction z of stacked body 12) at least in a cross section taken at the center in width direction y, as seen in width direction y.

Further, insulating layer 42 extends over the portion of the surface of first external electrode 22a located on second main surface 12b of stacked body 12, the portion of second main surface 12b located between first and second external electrodes 22a and 22b, and the portion of the surface of second external electrode 22b located on second main surface 12b of stacked body 12. Both end portions 42a, 42b of insulating layer 42 in length direction z of multilayer ceramic capacitor 10A are located on the outer side relative to both end surfaces 12e, 12f of stacked body 12 (i.e., on the side away from both end surfaces 12e, 12f of stacked body 12 along length direction z of stacked body 12) at least in a cross section taken at the center in width direction y, as seen in width direction y.

Multilayer ceramic capacitor 10A shown in FIG. 11 provides the following advantageous effects, as well as the same or similar advantageous effects as those of multilayer ceramic capacitor 10 shown in FIG. 1.

Insulating layer 42, being provided entirely or substantially entirely over second main surface 12b, is able to significantly increase the resistance to impact on second main surface 12b at the time of mounting. Also, short circuits on the second main surface that would be caused when multilayer ceramic capacitor 10A is resin-sealed are able to be significantly reduced or prevented. Further, the orientation of a mounting surface for multilayer ceramic capacitor 10A is able to be more easily determined.

As shown in, for example, FIGS. 14 and 15, a multilayer ceramic capacitor assembly 100A includes multilayer ceramic capacitor 10A and mounting board 102. Mounting board 102 includes board main body 104. Board main body 104 includes resin (e.g., glass epoxy) or ceramic (e.g., glass ceramic), for example. Board main body 104 may include, for example, a stack of a plurality of insulator layers. One of the main surfaces of board main body 104 includes mounting surface 106. Mounting surface 106 includes land electrodes 108 thereon which are, for example, rectangular or substantially rectangular in planar view. First and second external electrodes 22a and 22b are connected to and fixed to land electrodes 108 with, for example, solder 110, thus allowing multilayer ceramic capacitor 10A to be mounted. Accordingly, first and second external electrodes 22a and 22b located on first main surface 12a of stacked body 12 align with land electrodes 108.

Multilayer ceramic capacitor assembly 100A shown in FIG. 14 provides the same or similar advantageous effects as those of multilayer ceramic capacitor assembly 100 shown in FIG. 6.

Next, an electronic component assembly in a reference example of the present invention is described.

Figure 16:
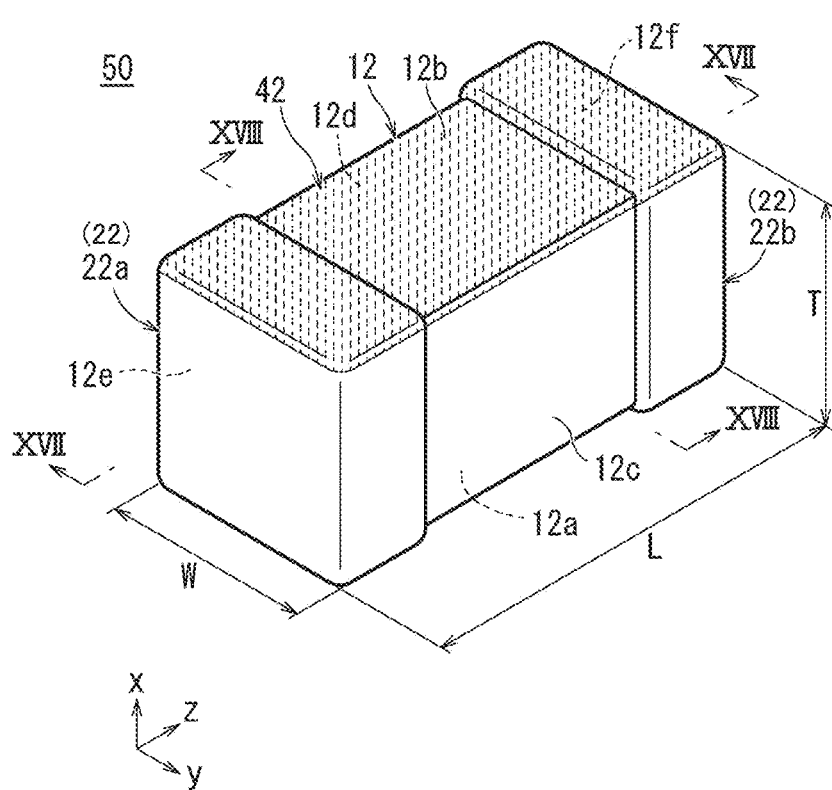
FIG. 16 is an outside perspective view of a multilayer ceramic capacitor included in an electronic component assembly in a reference example of the present invention.
Figure 17:
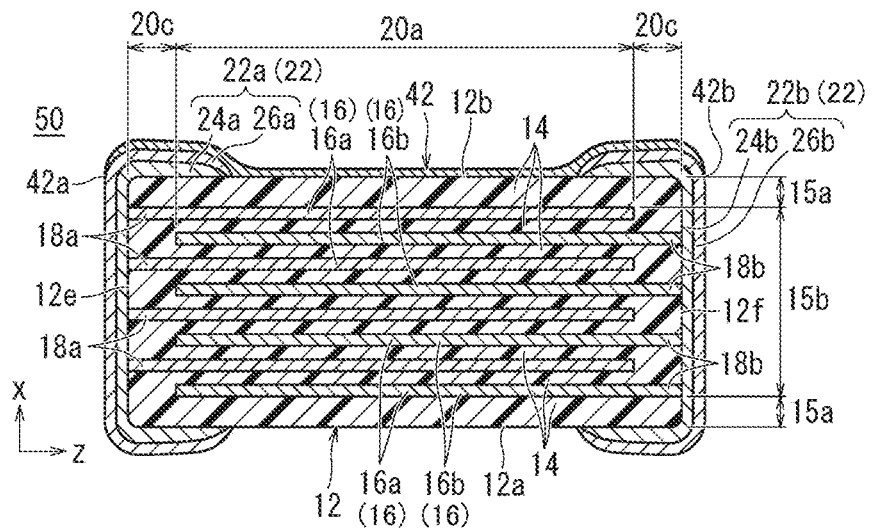
FIG. 17 is a cross-sectional view taken along line XVII-XVII shown in FIG. 16.
Figure 18:
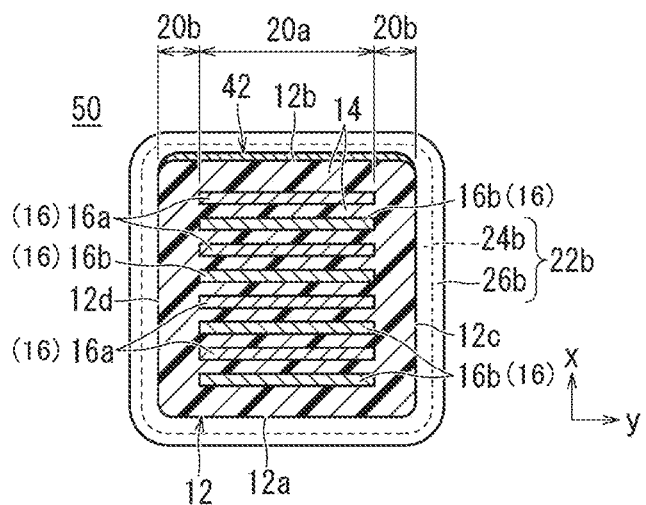
FIG. 18 is a cross-sectional view taken along line XVIII-XVIII shown in FIG. 16.

First, with reference to FIGS. 16 to 18, an example multilayer ceramic capacitor included in an electronic component assembly in the reference example of the present invention is described. Also, with reference to FIGS. 19 and 20, an example multilayer ceramic capacitor assembly including the multilayer ceramic capacitor (electronic component) is described.

FIG. 16 is an outside perspective view of the multilayer ceramic capacitor included in the electronic component assembly in the reference example of the present invention. FIG. 17 is a cross-sectional view taken along line XVII-XVII shown in FIG. 16. FIG. 18 is a cross-sectional view taken along line XVIII-XVIII shown in FIG. 16.

Figure 19:
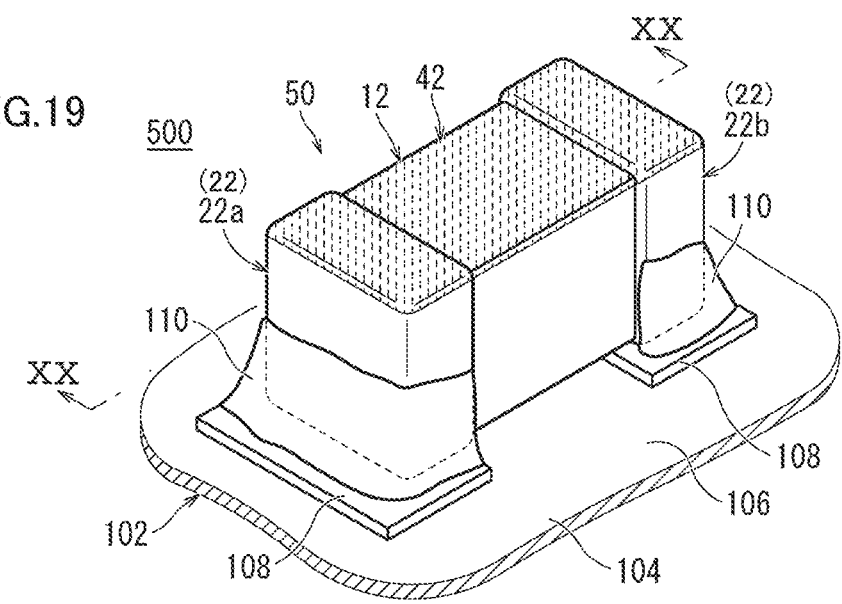
FIG. 19 is a perspective view of the principal portion of the electronic component assembly in the reference example of the present invention.
Figure 20:
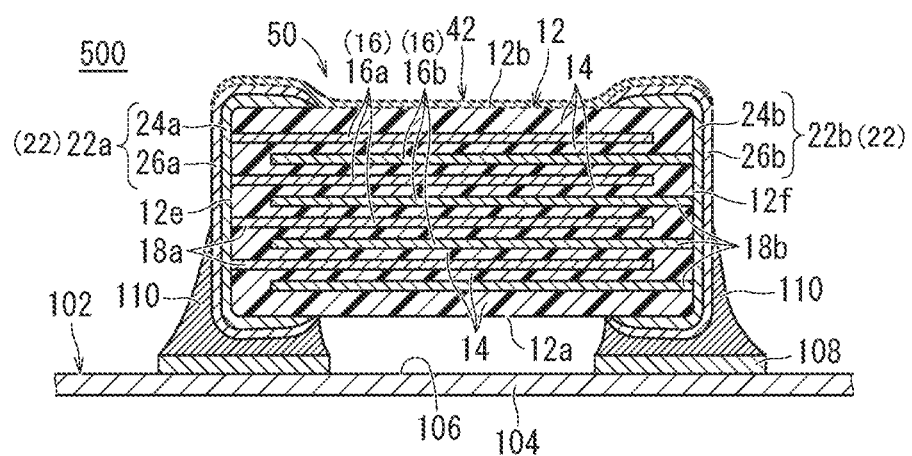
FIG. 20 is a cross-sectional view taken along line XX-XX shown in FIG. 19.

FIG. 19 is a perspective view of the principal portion of the electronic component assembly in the reference example of the present invention. FIG. 20 is a cross-sectional view taken along line XX-XX shown in FIG. 19.

A multilayer ceramic capacitor 50 shown in FIG. 16 is similar to multilayer ceramic capacitor 10 described with reference to FIGS. 1 to 5, except that, in multilayer ceramic capacitor 50, an insulating layer is provided only on second main surface 12b, with no insulating layer on first main surface 12a of stacked body 12. The portions the same as or substantially the same as those of multilayer ceramic capacitor 10 shown in FIGS. 1 to 5 are identically denoted, and the description thereof is omitted.

Also, a method for manufacturing a multilayer ceramic capacitor assembly shown in FIG. 19 is similar to the method for manufacturing the multilayer ceramic capacitor 10 assembly shown in FIG. 6, except in the location where the insulating layer is formed.

In the case of a chip electronic component, an external electrode material is applied to the end surfaces of a chip element and is then baked, thus forming external electrodes. To mount such a chip electronic component on a mounting board (substrate), solder cream is applied to land electrodes on the mounting board, so that the solder cream connects the land electrodes to the external electrodes of the chip electronic component. Accordingly, the chip electronic component is reflowed on the mounting board. Thus, the chip electronic component is mounted on the land electrodes on the mounting board.

In such a chip electronic component assembly, the surface tension of the solder cream usually allows the chip electronic component to be self-supporting. During the reflow, however, the solder cream melts on the land electrodes on the mounting surface of the mounting board, which may cause the chip electronic component to incline, according to the mounting condition. At this time, a corner of an external electrode of the chip electronic component may come into contact with an external electrode of an adjacent chip electronic component. Thus, such a conventional chip electronic component assembly may cause problems, for example, short circuits between chip electronic components.

According to the multilayer ceramic capacitor 50 shown in FIG. 16, an electronic component assembly 500 free from such problems, e.g., short circuits, is able to be provided. A method for manufacturing such electronic component assembly 500 is able to also be provided.

Multilayer ceramic capacitor 50 shown in FIG. 16 has insulating layer 42 extending entirely over second main surface 12b, including first and second external electrodes 22a and 22b exposed at second main surface 12b of stacked body 12.

Specifically, multilayer ceramic capacitor 50 includes insulating layer 42 extending over the portion of the surface of first external electrode 22a located on second main surface 12b of stacked body 12, the portion of second main surface 12b located between first and second external electrodes 22a and 22b, and the portion of the surface of second external electrode 22b located on second main surface 12b of stacked body 12. Both end portions 42a, 42b of insulating layer 42 in length direction z of multilayer ceramic capacitor 50 are located on the outer side relative to both end surfaces 12e, 12f of stacked body 12 (i.e., on the side away from both end surfaces 12e, 12f of stacked body 12 along length direction z of stacked body 12) at least in a cross section taken at the center in width direction y, as seen in width direction y. No insulating layer lies entirely or substantially entirely over first main surface 12a, including first and second external electrodes 22a and 22b exposed at first main surface 12a of stacked body 12.

According to multilayer ceramic capacitor 50 shown in FIG. 16, insulating layer 42, which is provided entirely or substantially entirely over second main surface 12b including first and second external electrodes 22a and 22b exposed at second main surface 12b of stacked body 12, is able to significantly increase the resistance to impact on the upper surface at the time of mounting. Also, short circuits on the upper surface that would be caused when multilayer ceramic capacitor 50 is resin-sealed are able to be significantly reduced or prevented.

As shown in, for example, 19 and 20, multilayer ceramic capacitor assembly 500 includes multilayer ceramic capacitor 50 and mounting board 102. Mounting board 102 includes board main body 104. Board main body 104 is preferably made of resin (e.g., glass epoxy) or ceramic (e.g., glass ceramic). Board main body 104 may include, for example, a stack of a plurality of insulator layers. One of the main surfaces of board main body 104 has mounting surface 106. Mounting surface 106 includes land electrodes 108 thereon which are, for example, rectangular or substantially rectangular in planar view. First and second external electrodes 22a and 22b are connected to and fixed to land electrodes 108 with, for example, solder 110, thus allowing multilayer ceramic capacitor 50 to be mounted. Accordingly, first and second external electrodes 22a and 22b located on first main surface 12a of stacked body 12 align with land electrodes 108.

According to multilayer ceramic capacitor assembly 500 shown in FIG. 19, multilayer ceramic capacitor 50 mounted on mounting board 102 includes insulating layer 42 extending entirely or substantially entirely over second main surface 12b, including first and second external electrodes 22a and 22b exposed at second main surface 12b of stacked body 12. Accordingly, during the reflow of mounting board 102 with multilayer ceramic capacitor 50 mounted thereon, even if at least one of first and second external electrodes of an adjacent multilayer ceramic capacitor slips and touches multilayer ceramic capacitor 50, insulating layer 42 interposed between the first and second external electrodes is able prevent problems, for example, short circuits.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. An electronic component assembly comprising:
   an electronic component including:
      a stacked body including a plurality of stacked ceramic layers, the stacked body including:
         a first main surface and a second main surface opposite to each other in a stacking direction;
         a first lateral surface and a second lateral surface opposite to each other in a width direction orthogonal or substantially orthogonal to the stacking direction; and
         a first end surface and a second end surface opposite to each other in a length direction orthogonal or substantially orthogonal to the stacking direction and the width direction;
      a first external electrode covering the first end surface, and extending from the first end surface to cover a portion of each of the first main surface, the second main surface, the first lateral surface, and the second lateral surface;
      a second external electrode covering the second end surface, and extending from the second end surface to cover a portion of each of the first main surface, the second main surface, the first lateral surface, and the second lateral surface; and
      an insulating layer covering the first main surface of the stacked body, a portion of the first external electrode exposed at the first main surface, and a portion of the second external electrode exposed at the first main surface; and
   a mounting board including:
      a board main body including a mounting surface; and
      a land electrode on the mounting surface; wherein
   the first main surface of the electronic component faces the mounting surface of the mounting board;
   the first external electrode and the second external electrode are mounted on the land electrode with solder;
   in a cross section taken at a center or approximate center in the width direction, the insulating layer has a filling ratio of about 90% or more; and
   both end portions of the insulating layer in the length direction are located on an outer side relative to the first and second end surfaces of the stacked body at least in the cross section taken at the center or the approximate center in the width direction.

2. The electronic component assembly according to claim 1, wherein the insulating layer entirely covers the first main surface of the electronic component.

3. The electronic component assembly according to claim 1, wherein the insulating layer is not provided on the first lateral surface and the second lateral surface of the electronic component.

4. The electronic component assembly according to claim 1, wherein the insulating layer is made of a ceramic.

5. The electronic component assembly according to claim 4, wherein the ceramic included in the insulating layer is smaller in grain size than ceramic included in the ceramic layers of the stacked body.

6. The electronic component assembly according to claim 4, wherein the ceramic included in the insulating layer is at least one of $Al_2O_3$, PZT, SiC, $SiO_2$, and MgO.

7. The electronic component assembly according to claim 1, wherein the insulating layer has a thickness of about 5.0 μm or less.

8. The electronic component assembly according to claim 1, wherein the insulating layer covers the second main surface of the stacked body, a portion of the first external electrode exposed at the second main surface, and a portion of the second external electrode exposed at the second main surface.

9. The electronic component assembly according to claim 1, wherein the electronic component assembly includes a space where the insulating layer and the solder are not in contact with each other, the space being defined by the insulating layer and the land electrode.

10. The electronic component assembly according to claim 1, wherein the electronic component satisfies the condition of $t_0/T \leq$ about 0.1, where T is a dimension of electronic component in the stacking direction, and $t_0$ is a dimension of insulating layer in the stacking direction at an end surface of the insulating layer.

11. The electronic component assembly according to claim 1, wherein each of the plurality of stacked ceramic layers is at least one of a piezoelectric ceramic, a semiconductor ceramic, and a magnetic ceramic.

12. The electronic component assembly according to claim 1, wherein the insulating layer includes a resin.

13. The electronic component assembly according to claim 12, wherein the resin included in the insulating layer is at least one of epoxy resin, silicone resin, fluorine resin, phenolic resin, urea resin, melamine resin, unsaturated polyester resin, barium titanate, alumina, silica, yttria, and zirconia.

14. The electronic component assembly according to claim 1, wherein the stacked body further includes a plurality of internal electrode layers provided on the plurality of stacked ceramic layers.

15. The electronic component assembly according to claim 1, wherein
the plurality of internal electrode layers includes a plurality of first internal electrode layers that are electrically connected to the first external electrode; and
the plurality of internal electrode layers includes a plurality of second internal electrode layers that are electrically connected to the second external electrode.

* * * * *